Figure 1A:

United States Patent [19]

Harms et al.

[11] Patent Number: 4,994,141

[45] Date of Patent: Feb. 19, 1991

[54] METHOD OF MANUFACTURING A MASK SUPPORT OF SIC FOR RADIATION LITHOGRAPHY MASKS

[75] Inventors: Margret Harms, Hamburg; Holger Luthje, Halstenbek; Bernd Matthiesen, Hamburg, all of Fed. Rep. of Germany

[73] Assignee: U.S. Philips Corporation, New York, N.Y.

[21] Appl. No.: 446,519

[22] Filed: Dec. 4, 1989

[30] Foreign Application Priority Data

Dec. 8, 1988 [DE] Fed. Rep. of Germany ....... 3841352

[51] Int. Cl.$^5$ ...................... H01L 21/306; B44C 1/22; C23F 1/02; C03C 15/00
[52] U.S. Cl. .................................... 156/643; 156/633; 156/647; 156/652; 156/657; 156/659.1; 156/662
[58] Field of Search ............... 156/643, 646, 647, 652, 156/657, 659.1, 662, 629, 633; 430/5, 321; 378/34, 35

[56] References Cited

U.S. PATENT DOCUMENTS 4,668,336 5/1987 Shimkunas ......................... 156/643
4,680,243 7/1987 Shimkunas et al. ............ 156/633 X Primary Examiner—William A. Powell
Attorney, Agent, or Firm—Paul R. Miller

[57] ABSTRACT

The invention relates to a method of manufacturing a mask support (diaphragm) of SiC for radiation lithography masks, in which an SiC layer is deposited at least on one of the two major surfaces of a substrate in the form of a silicon single crystal wafer and the silicon single crystal wafer is removed except at an edge region by means of a selective etching step, the mask support being annealed before or after the selective etching step in an oxidizing atmosphere at a temperature in the range of 200° to 1350° C. for a duration of 2 to 10 h.

27 Claims, 1 Drawing Sheet

METHOD OF MANUFACTURING A MASK SUPPORT OF SIC FOR RADIATION LITHOGRAPHY MASKS

The invention relates to a method of manufacturing a mask support (diaphragm) of SiC for radiation lithography masks, in which an SiC layer is deposited at least on one of the two major surfaces of a substrate in the form of a silicon single crystal wafer and the silicon single crystal wafer is removed except at an edge region by means of a selective etching step.

In the work of E. Spiller and R. Feder "X-ray lithography" in "Topics in current physics: X-ray optics", Springer, New York, 1977, pp. 35 to 92, it is shown what is the importance of the radiation lithography in the manufacture of, for example, semiconductor systems or magnetic cylinder domain devices, because especially in these manufacturing processes structures of gradually decreasing dimensions in the μm or nm range become increasingly interesting. For all methods with high resolution, accurate and extremely precisely defined masks are required. The performance of the radiation lithography becomes clear by the minimum strip width of the structures, which can be attained therewith: light lithography about 2 to 3 μm, electron beam lithography about 0.5 to 0.1 82 m, X-ray lithography smaller than 500 nm.

The mask support manufactured by means of the method according to the present invention is generally suitable for all kinds of radiation lithography masks; the description of the requirement profile for such a mask is given below with a view to X-ray lithography.

The use of, for example, X-rays for the exposure of a photoresist to be structured affords the advantage that disturbing diffraction phenomena during the projection of the mask structures onto the photoresist layer are reduced.

For exposure with X-rays, special irradiation masks for obtaining a structure in the resist are required. Such a mask consists of the pattern of the structure to be manufactured of a material strongly absorbing X-rays (absorber), the absorber pattern being provided on a thin mask support, i.e. the diaphragm, of a material as transparent as possible to X-rays. Materials having a highest possible atomic weight are suitable for the absorber; and in practice, for example, gold or tungsten have proved satisfactory. As a material for the diaphragm, more or less practically all the materials are suitable which are sufficiently transparent to X-rays.

Since in the case of X-ray lithography a comparatively soft radiation ($\lambda = 0.5$ to 2 nm) is used, X-ray lithography masks must be composed of comparatively thin diaphragms, which support the absorber structures obtained in submicron dimensions. By a suitable choice of the materials and of the manufacturing processes, on the one hand, it must be ensured that the masks are sufficiently transparent both with respect to the X-ray radiation and with respect to the radiation from the visible range of the spectrum required for adjustment. The diaphragm thickness limited thereby lies in the range of a few microns. On the other hand, the masks must have a sufficient contrast for structure multiplication.

Since also heavy elements, from which the absorber structures are formed, are not at all entirely opaque with respect to X-ray radiation, the absorber structures generally must be applied in a thickness of approximately 1 μm. Great difficulties are involved in the realization of these conditions for the manufacturing technique.

The gradually decreasing dimensions of the structures of elements manufactured by means of X-ray lithography moreover require masks whose accuracy to size is allowed to fluctuate within only very narrow tolerance limits ($<100$ nm). Thus, the manufacturing technique meets serious problems because these narrow tolerance limits must be maintained in spite of many greatly different processing steps for the manufacture of the masks and also for a long life of the masks with up to $10^{16}$ exposures per mask by high-intensity X-ray radiation. The great importance of the mechanical stability of the diaphragm appears from these requirements. Since the mechanical stability of a diaphragm can be characterized by its elasticity module, this value is indicated together with other properties in the following Table 1 for the most important known diaphragm materials.

TABLE 1

| Material | Thermal expansion $[K^{-1}]$ | Elasticity module $[N/m^2]$ | Refractive index | Density $[g/cm^3]$ |
|---|---|---|---|---|
| SiC | $4.7 \cdot 10^{-6}$ | $4.57 \cdot 10^{11}$ | 2.48 | 3.2 |
| Si | $2.6 \cdot 10^{-6}$ | $1.62 \cdot 10^{11}$ | 3.9 | 2.42 |
| Si$_3$N$_4$ | $2.7 \cdot 10^{-6}$ | $1.55 \cdot 10^{11}$ | 2.2 | — |
| BN | $1 \cdot 10^{-6}$ | $1.33 \cdot 10^{11}$ | 2.0 | 2.34 |
| Be | $12.3 \cdot 10^{-6}$ | $3.02 \cdot 10^{11}$ | — | 1.85 |
| Mg | $26 \cdot 10^{-6}$ | $0.45 \cdot 10^{11}$ | — | 1.74 |
| Ti | $9 \cdot 10^{-6}$ | $1.1 \cdot 10^{11}$ | — | 4.52 |

It appears from the table that SiC is a particularly suitable material for diaphragms for X-ray lithography masks because of its high elasticity module, but also because of its optical properties.

Beside the required mechanical rigidity, moreover the topography (surface roughness or roughness height) and induced stresses play an important part.

German Patent Application P 37 33 311.9 discloses a method of manufacturing a mask support of SiC for X-ray lithography masks, by means of which smooth SiC diaphragms can be manufactured, in which comparatively little stress occurs and which also have a sufficient transparency in the range of the visible light. According to this known method, the manufacture of SiC layers is effected by means of an optimized chemical vapour deposition process in such a manner that a comparatively smooth SiC layer, which is acted upon, however, by a high stress, is applied to a silicon single crystal substrate and the stress is reduced in a desired manner in a following processing step by means of implanted ions. This process may lead to a deterioration of the optical transparency, depending upon the kind of ions chosen and the dose thereof.

The invention has for its object to improve the method mentioned in the opening paragraph in such a manner that SiC diaphragms can be manufactured by means of a less laborious method, which diaphragms have a lower stress and in the range of visible light a higher transparency with respect to the SiC diaphragms manufactured by means of the method mentioned in the opening paragraph.

According to the invention, this object is achieved in that the mask support is annealed before or after the selective etching step in an oxidizing atmosphere at a temperature in the range of from 200° to 1350° C. for a duration of 2 to 10 h.

According to an advantageous further embodiment of the method in accordance with the invention, the mask support is annealed in an oxygen atmosphere at a temperature of 1100° C. for a duration of 4 h. Experiments which have led to the invention have surprisingly shown that by an annealing step in an oxidizing atmosphere and by the associated deposition of an oxide layer on the SiC layer the stress in the SiC layer can be reduced reproducibly in a desired manner and the transparency to radiation from the visible part of the spectrum can be considerably increased at the same time. Roughness measurements clearly show that the oxidation of the surface of the SiC layer also leads to a reduction of the surface roughness (roughness height) of the SiC layer, which is of particular advantage with a view to the identification of adjustment figures by means of visible light. Due to the oxide layer, the reflection of the SiC layer, which is a consequence of the comparatively high refractive index of SiC, is reduced because the oxide layer acts as an anti-reflex coating. The formation of an oxide layer on the SiC layer has proved to be advantageous also with a view to the later production of absorber patterns on the diaphragm formed from the SiC layer, which patterns have a strip width less than 0.5 $\mu$m; with these small strip widths, surface roughnesses of the diaphragm already have a very disadvantageous effect.

According to a further advantageous embodiment of the method in accordance with the invention, the annealing process is carried out only in selected regions of the SiC layer by means of heating of these regions by laser radiation in an oxidizing atmosphere. This procedure is suitable, for example, to optimize the region of the SiC layer, on which adjustment figures are to be later formed, with respect to its optical properties.

According to a preferred embodiment of the method in accordance with the invention, an SiC nucleation layer is formed on the silicon single crystal wafer with the action of a hydrocarbon gas. This involves the advantage that a more homogeneous alignment of the SiC crystallites of the subsequently applied SiC layer in the preferential direction is attained. As a result, the optical and topographical properties of the SiC layer are improved.

According to a further favourable embodiment of the method in accordance with the invention, before the annealing treatment ions are implanted into the SiC layer for mechanically disturbing the crystal structure of the SiC layer. Also in the case of cooperation of an SiC layer, into which ions were implanted for disturbing the lattice, with an oxide layer subsequently formed on it, advantages are obtained with respect to the stress behaviour and the optical transparency. By means of the method known from German Patent Application P 37 33 311.9, SiC layers having a high tensile stress in the range of $x.10^8$ N/m$^2$ and having a small roughness height in the nm range are attained.

Due to the implantation of ions disturbing the crystal structure of the deposited SiC layer, the tensile stress values can be adjusted in a range of $x.10^7$ N/m$^2$. For the transparency of these layers to radiation in the wavelength range between 633 and 800 nm, values up to 32% were measured. If SiC layers thus manufactured are now additionally provided with an oxide layer by thermal oxidation (by annealing, for example, in an oxygen atmosphere), the values for the transparency to radiation from the wavelength range between 633 and 800 nm can be increased to 70%.

The present method of thermal oxidation of SiC layers, which are to be used as diaphragms for radiation lithography masks, therefore involves the following advantages.

A reduction of the short-wave roughness of the surface of the SiC layer can be achieved, which is not only advantageous for the identification of adjustment figures formed on the oxidized SiC layer, but which also favours the manufacture of absorber structures having a particularly small strip width in the range below 0.5 $\mu$m; the optical transparency in the wavelength range between 633 and 800 nm of an SiC layer can be considerably improved by an oxidation, depending upon the layer thickness; likewise, the tensile stress in an SiC layer manufactured more particularly by Chemical Vapour Deposition (CVD) can be reduced.

Further details and advantages of the present method will be explained with reference to the embodiment described below.

In the drawing, FIGS. 1(a)–(e) show a diagrammatic representation of the course of the process of coating a substrate with an SiC layer, of forming an SiC diaphragm after removing a part of the substrate and of forming an oxide layer on the SiC diaphragm by thermal oxidation.

Figure 1B:
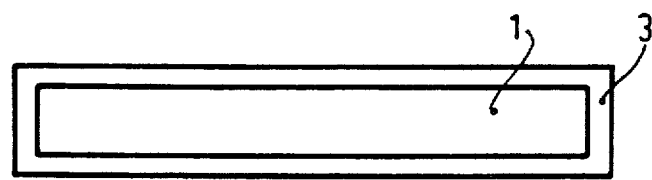
Figure 1C:
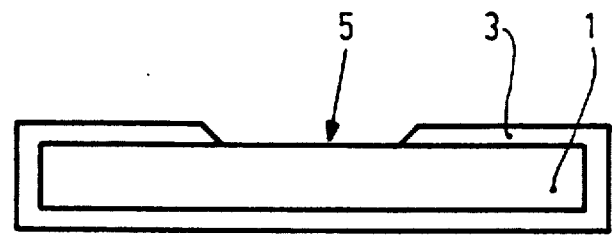
Figure 1D:
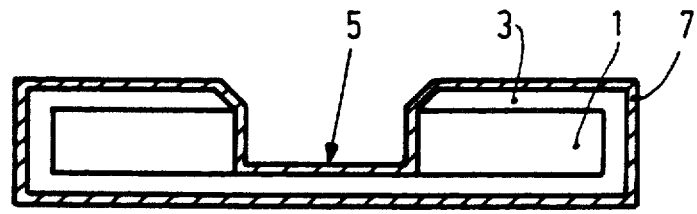
Figure 1E:
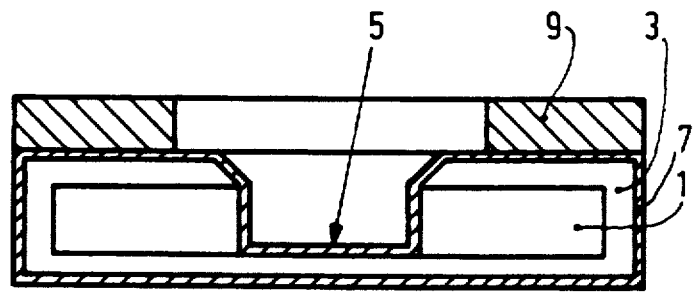

For the substrate 1 use is made of a commercially available silicon single crystal wafer with [100] orientation, on which an about 2.5 $\mu$m thick SiC layer 3 is deposited on all sides (FIGS. 1a, 1b). Instead of a silicon single crystal wafer oriented in [100] direction, use may also be made of a silicon single crystal wafer which is orientated in a [111] direction. The desired diaphragm region 5 is defined by a mechanical mask (not shown) and the SiC layer 3 is removed in this region, for example, by reactive ion etching in an SF$_6$ atmosphere (FIG. 1c). The substrate 1 is then removed in a selectively acting etchant, for example KOH, by a wet-chemical treatment in the diaphragm region 5. Subsequently, an oxide layer 7 is formed on the surface of the SiC layer 3 (FIG. 1d) by annealing in an oxidizing atmosphere (thermal oxidation). The manufacture of the mask support is effected in that the etched substrate 1 with the layers 3 and 7 provided thereon is adhered to a glass ring 9 having a thickness of, for example, 5 mm (FIG. 1e).

Since the quality of the mask support (diaphragm) is essentially influenced by the coating process, the SiC deposition is of major importance. Besides the desired mechanical rigidity, further criteria essential to the use as diaphragm are the stress and roughness height of the SiC layer. It has been found that the layer properties can be considerably influenced with deposition from the gaseous phase at a sufficient concentration of silicon and hydrocarbons in the reaction gas (for example dichlorodimethyl silane (CH$_3$)$_2$SiCl$_2$, and propane C$_3$H$_8$, in H$_2$ as a carrier gas) by the coating temperature and the quantity of hydrocarbon serving as carbon source and participating in the process. With increasing temperature, a reduction of the tensile stress takes place towards an oppositely directed compression stress. In general, the temperature shifts to lower ranges for obtaining SiC layers having little stress with increasing propane content. Comparable results were also obtained with silane SiH$_4$, and toluene C$_7$H$_8$, and with silane, SiH$_4$, and propane, C$_3$H$_8$, respectively. An analysis of layers uniformly leads to a polycrystalline structure, which is essentially $\beta$-orientated. In all cases, the hydrogen and chlorine concentrations were less than 3 at .%, independently of the hydrocarbon content of the reaction gas. The elasticity module was determined at $4.6 \times 10^{11}$ N/m$^2$. With respect to the optical transparency, values of more than 50% were measured in the wavelength range between 700 and 800 nm on 2.5 μm thick SiC layers and these values can be increased after the formation of the oxide layer on the SiC layer to more than 70%.

Since a surface roughness (roughness height) is immanent to the polycrystalline structure of the SiC layer, also this property was extensively examined. The values for the roughness height ($R_t$) determined mechanically by means of a scanning system are also considerably influenced by the reaction temperature and the hydrocarbon content during the manufacture of the SiC layer. Since an optimization of the manufacturing process for the diaphragm both with respect to a lowest possible tensile stress ($\sigma$ about $5 \times 10^7$ N/m$^2$) and with respect to a smallest possible roughness height ($R_t < 30$ nm) should be obtained, a compromise must be searched because either only comparatively rough layers ($R_t$ about 100 nm), which considerably limit the adjustment and structure quality of the mask, or only smooth layers ($R_t$ about 10 nm) having a higher tensile stress ($\sigma$ about $4 \times 10^8$ N/m$^2$) can be manufactured.

In order to achieve that SiC layers can be manufactured by means of an inexpensive process, which are smooth and have comparatively little stress, the diaphragm according to the invention is manufactured in two processing steps, in the first step an SiC layer having a higher tensile stress and already comparatively small roughness height being deposited on the silicon single crystal substrate 1, while in the second step of the process, preferably after a part of the substrate 1 in the diaphragm region 5 has been etched, an oxide layer is formed on this SiC layer by means of an annealing process in an oxidizing atmosphere. By this oxidation step, not only a reduction of the stress within the SiC layer 3, but also a further reduction of the roughness height of the SiC layer 3 is obtained, the values for the optical transparency in the wavelength range of 600 to 1000 nm, more particularly 633 to 800 nm, also being improved. In this connection, reference is made to Table 2.

For the manufacture of a 2.5 μm thick SiC layer 3 with a subsequently applied about 110 nm thick oxide layer 7, the following conditions are used:

1. Heating of the substrate in the form of a [100] or [111] orientated silicon single crystal wafer to a temperature of 1110° C. in an atmosphere of H$_2$;
2. etching of the substrate in HCl for a duration of 4 minutes;
3. rinsing of the etched substrate in H$_2$ for a duration of 4 minutes;
4. SiC deposition from a reaction gas containing 1.4% of dichlorodimethyl silane (CH$_3$)$_2$SiCl$_2$ in H$_2$ carrier gas plus 15% of propane, C$_3$H$_8$, related to dichlorodimethyl silane; deposition time 60 s;
5. cooling in an atmosphere of H$_2$ to room temperature.

The SiC layer thus manufactured has a height of roughness $R_t$ less than 45 nm. The tensile stress determined via the substrate deformation is about 2.5 to $5 \times 10^8$ N/m$^2$. The optical transparency in the wavelength range of 633 to 800 nm lies in the range of about 38 to about 70%.

Subsequently, the SiC layer 3 provided on the substrate 1 is subjected to an annealing process in an oxidizing atmosphere. To this end, the substrate 1 provided with the SiC layer 3 is heated to a temperature in the range of 1000° to 1350° C., preferably 1100° C., in a furnace, into which oxygen is introduced as oxidizing gas. After the desired annealing temperature has been reached, this temperature is maintained for a duration of 2 to 4 h, preferably 4 h, whereupon it is cooled to room temperature.

It appears from the following table 2 how a thermal oxidation influences at different annealing temperatures in the range of 900° to 1100° C. and for different durations of the annealing process in the range of 4 to 8 h the values for the optical transparency, the stress and the height of roughness of an SiC diaphragm.

TABLE 2

Thermal oxidation of SiC-diaphragms

| | | | | Properties before annealing | | | | Properties after annealing | | | |
|---|---|---|---|---|---|---|---|---|---|---|---|
| Ex- | Annealing | | | Transparency [%] | | | Roughness | Transparency [%] | | | Roughness |
| ample | Duration | Temp. | Atmo- | λ = 633 | λ = 800 | Stress | height | | | Stress | height |
| No. | [h] | [°C.] | sphere | nm | nm | [× 10$^8$N/m$^2$] | [nm] | λ = 633 nm | λ = 800 nm | [× 10$^8$N/m$^2$] | [nm] |
| 1 | 4 | 900 | O$_2$ | 38 | 56 | 2.69 | — | 43 | 66 | 2.35 | — |
| 2 | 8 | 900 | O$_2$ | 47 | 63 | 2.92 | — | 55.5 | 74.5 | 2.27 | — |
| 3 | 6 | 1050 | O$_2$ | 50 | 70 | 2.73 | 32 | 54 | 75 | 1.61 | 22 |
| 4 | 2 | 1100 | O$_2$ | 39 | 60 | 2.72 | — | 49.5 | 76 | 1.43 | — |
| 5 | 4 | 1100 | O$_2$ | 46 | 62 | 2.91 | — | 64.5 | 76 | 1.34 | — |
| 6 | 6 | 1100 | O$_2$ | 50 | 72.5 | 2.89 | 26 | 59 | 81.5 | 0.90 | 10 |
| 7 | 8 | 1100 | O$_2$ | 49 | 62 | 2.96 | 44 | 68 | 75 | 1.23 | 24 |

It is shown in the following table 3 how an annealing process in oxygen O$_2$ at temperatures in the range of 200° to 1100° C. and for a duration of 2 h influences the values for the optical transparency in the wavelength range of 633 to 800 nm and for the stress in SiC diaphragms, into which boron ions were implanted at a dose of 10$^{15}$/cm$^2$ at an implantation energy in the range of 150 to 400 keV. With increasing temperature, the values for the transparency are improved up to 70%, the values for the stress being maintained within a tolerable range.

TABLE 3

| | Annealing | | | Thermal oxidation of SiC-diaphragms, into which boron ions were implanted at a dose of $10^{15}/cm^2$ | | | | | |
|---|---|---|---|---|---|---|---|---|---|
| | | | | Properties before annealing | | | Properties after annealing | | |
| | Duration | Temp. | Atmo- | Transparency [%] | | Stress | Transparency [%] | | Stress |
| Example No. 12 | [h] | [°C.] | sphere | $\lambda = 633$ nm | $\lambda = 800$ nm | $[\times 10^7 N/m^2]$ | $\lambda = 633$ nm | $\lambda = 800$ nm | $[\times 10^7 N/m^2]$ |
| 11 | 2 | 200 | $O_2$ | 15 | 29 | 7.1 | 16 | 33 | 8.3 |
| 13 | 2 | 1100 | $O_2$ | 19 | 32 | 5.2 | 49 | 70 | 16 |

The method proceeds so that the silicon single crystal substrate 1 is provided on all sides with an SiC layer 3, after which the processing steps for removing the silicon single crystal substrate 1 in the diaphragm region 5 and forming the oxide layer 7 on the SiC layer 3 and the exposed regions of the silicon single crystal substrate 1 are carried out. However, the method also proceed so that the silicon single crystal substrate 1 is first oxidized, after the SiC layer 3 has been provided, for forming the oxide layer 7, after which in the diaphragm region 5 the silicon single crystal wafer 1 with the layers provided on this substrate part (SiC layer 3 and oxide layer 7) is removed by a selective etching process.

If the lattice structure of the SiC layer 3 should be disturbed by ion bombardment before the oxide layer 7 is formed on the SiC layer 3, the method proceeds so that the substrate 1 is provided on all sides with an SiC layer 3, that then the central part of the silicon single crystal substrate 1 located in the diaphragm region 5 in accordance with the diaphragm to be manufactured is removed together with the SiC layer 3 disposed on it by a selective etching process, and that subsequently the desired ions are implanted into the remaining exposed SiC layer 3, which already constitutes the diaphragm. In this case, the ion implantation may also take place, for example, from the back side of the diaphragm.

The method also proceeds so that the SiC layer 3 provided on all sides on the silicon single crystal substrate 1 is subjected to an ion bombardment before the selective etching process for removing the silicon single crystal substrate 1 in the diaphragm region 5 is carried out.

The method also proceeds so that the silicon single crystal substrate 1 is provided only at one of its major surfaces with an SiC layer 3 and after implantation of the desired ions an etching mask (disposed loosely or deposited from the gaseous phase) is provided on the major surface of the silicon single crystal substrate 1 not coated with SiC, after which the silicon single crystal substrate 1 in the diaphragm region 5 is removed by a selective etching process.

Boron, carbon, nitrogen, silicon or hydrogen ions may be implanted into the SiC layer 3. The implantation data can be determined without difficulty by a person skilled in the art within the scope of the present method in the range of the desired stress reduction.

We claim:

1. A method of manufacturing a mask support (diaphragm) of SiC for radiation lithography masks, in which a SiC layer is deposited at least on one of the two major surfaces of a substrate in the form of a silicon single crystal wafer and the silicon single crystal wafer is removed, except an edge region, by means of a selective etching step, characterized in that the mask support is annealed before or after the selective etching step in an oxidizing atmosphere at a temperature in the range of 200° to 1350° C. for a duration of 2 to 10 h.

2. A method as claimed in claim 1, characterized in that the mask support is annealed in an oxygen atmosphere at a temperature of 1100° C. for a duration of 4 h.

3. A method as claimed in claim 2, characterized in that the annealing process is carried out only in selected regions of the SiC layer by means of heating of these regions by laser radiation in an oxidizing atmosphere.

4. A method as claimed in claim 2, characterized in that the SiC layer is deposited on the substrate by means of chemical vapour deposition (CVD).

5. A method as claimed in claim 4, characterized in that the silicon single crystal wafer is first heated in the arrangement used for the deposition process to a temperature in the range of 1000° to 1350° C. in an atmosphere of $H_2$, is then etched by a suitable etchant and is subsequently rinsed under the action of $H_2$, whereupon the SiC layer is provided from atmosphere containing silicon and hydrocarbons and the coated substrate is cooled to room temperature in an atmosphere of $H_2$.

6. A method as claimed in claim 5, characterized in that the silicon single crystal wafer is heated to a temperature of 1100° C. before the deposition of the SiC layer.

7. A method as claimed in claim 6, characterized in that a SiC nucleation layer is formed on the silicon single crystal wafer under the action of a hydrocarbon gas.

8. A method as claimed in claim 6, characterized in that as reaction gas for depositing the SiC layer 0.05 to 8.0% of dichlorodimethyl silane $(CH_3)_2SiCl_2$ in hydrogen, $H_2$, plus 15% of propane $C_3H_8$, is used.

9. A method as claimed in claim 6, characterized in that as reaction gas for depositing the SiC layer silane, $SiH_4$, with toluene, $C_7H_8$ is used.

10. A method as claimed in claim 6, characterized in that as reaction gas for depositing the SiC layer silane $SiH_4$, with propane, $C_3H_8$, is used.

11. A method as claimed in claim 1, characterized in that the SiC layer is deposited in a thickness of 1.5 to 3.0 μm.

12. A method as claimed in claim 1, characterized in that an oxide layer having a thickness in the range of 50 to 200 nm is formed on the SiC layer.

13. A method as claimed in claim 1, characterized in that before the annealing step ions are implanted into the SiC layer for mechanically disturbing the crystal structure of the SiC layer.

14. A method as claimed in claim 13, characterized in that boron ions are implanted into the SiC layer at a dose of $10^{15}$ to $10^{16}/cm^2$ at an implantation energy in the range of 150 to 400 keV.

15. A method as claimed in claim 13, characterized in that carbon ions are implanted into the SiC layer at a dose of $10^{15}$ to $5.10^{16}/cm^2$ at an implantation energy in the range of 150 to 400 keV.

16. A method as claimed in claim 13, characterized in that nitrogen ions are implanted into the SiC layer at a dose of $10^{15}$ to $5.10^{16}/cm^2$ at an implantation energy in the range of 150 to 400 keV.

17. A method as claimed in claim 1, characterized in that the silicon single crystal wafer is orientated in the direction.

18. A method as claimed in claim 1, characterized in that the single crystal wafer is orientated in the direction.

19. A method as claimed in claim 1, characterized in that the SiC layer is deposited on the substrate by means of chemical vapor deposition (CVD).

20. A method as claimed in claim 19, characterized in that the silicon single crystal wafer is first heated in the arrangement used for the deposition process to a temperature in the range of 1000° to 1350° C. in an atmosphere of $H_2$, is then etched of a suitable etchant, and is subsequently rinsed under the action of $H_2$, whereupon the SiC layer is provided from atmosphere containing silicon and hydrocarbons and the coated substrate is cooled to room temperature in an atmosphere of $H_2$.

21. A method as claimed in claim 20, characterized in that the silicon single crystal wafer is heated to a temperature of 1100° C. before the deposition of the SiC layer.

22. A method as claimed in claim 21, characterized in that an SiC nucleation layer is formed on the silicon single crystal wafer under the action of a hydrocarbon gas.

23. A method as claimed in claim 21, characterized in that as reaction gas for depositing the SiC layer 0.05 to 8.0 percent of dichlorodimethyl silane $(CH_3)_2SiCl_2$, in hydrogen, $H_2$, plus 15 percent of propane, $C_3H_8$, is used.

24. A method as claimed in claim 21, characterized in that as reaction gas for depositing the SiC layer silane, $SiH_4$, with toluene, $C_7H_8$, is used.

25. A method as claimed in claim 21, characterized in that as reaction gas for depositing the SiC layer silane, $SiH_4$, with propane, $C_3H_8$, is used.

26. A method as claimed in claim 8, characterized in that 1.4 percent of dichlorodimethyl silane is used.

27. A method as claimed in claim 23, characterized in that 1.4 percent of dichlorodimethyl silane is used.

* * * * *